United States Patent
McNeill et al.

(10) Patent No.: US 8,988,832 B2
(45) Date of Patent: Mar. 24, 2015

(54) MAGNETORESISTIVE SENSOR SHIELD

(71) Applicant: Seagate Technology LLC, Cupertino, CA (US)

(72) Inventors: Kevin McNeill, Derry (IE); Aidan Goggin, Co. Donegal (IE); Marcus Ormston, Derry (IE); Victor Boris Sapozhnikov, Minnetonka, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/953,936

(22) Filed: Jul. 30, 2013

(65) Prior Publication Data

US 2015/0036246 A1 Feb. 5, 2015

(51) Int. Cl.
*G11B 5/39* (2006.01)
*G11B 5/11* (2006.01)
(52) U.S. Cl.
CPC ........................................ *G11B 5/11* (2013.01)
USPC ......................................................... 360/319
(58) Field of Classification Search
USPC ....................................... 360/319, 324–324.2
See application file for complete search history.

(56) References Cited

U.S. PATENT DOCUMENTS

| | | | |
|---|---|---|---|
| 7,180,712 B1 * | 2/2007 | Li et al. .......................... | 360/319 |
| 7,974,048 B2 * | 7/2011 | Shimazawa et al. .......... | 360/319 |
| 8,014,108 B2 * | 9/2011 | Shimazawa et al. .......... | 360/319 |
| 8,437,106 B2 * | 5/2013 | Yanagisawa et al. ......... | 360/319 |
| 8,451,567 B2 * | 5/2013 | Zhou et al. ................ | 360/324.12 |
| 8,514,524 B2 * | 8/2013 | Wu et al. ....................... | 360/319 |
| 8,531,801 B1 * | 9/2013 | Xiao et al. .................... | 360/319 |
| 8,630,068 B1 * | 1/2014 | Mauri et al. .................. | 360/319 |
| 8,630,069 B1 * | 1/2014 | Okawa et al. ................. | 360/319 |
| 8,638,530 B1 * | 1/2014 | Hsu et al. ...................... | 360/319 |
| 8,760,820 B1 * | 6/2014 | McKinlay et al. ............ | 360/319 |
| 2012/0327531 A1 | 12/2012 | Takahashi et al. | |

* cited by examiner

*Primary Examiner* — Will J Klimowicz
(74) *Attorney, Agent, or Firm* — HolzerIPLaw, PC (57) ABSTRACT

Implementations disclosed herein allow a signal detected by a magnetoresistive (MR) sensor to be improved by providing for a region of reduced anisotropy within a synthetic antiferromagnetic (SAF) shield. The SAF shield includes first and second layers of ferromagnetic material separated by a coupling spacer layer. A distance between the first and second layers of ferromagnetic material is greater in a region proximal to the sensor stack than in a region away from the sensor stack.

14 Claims, 10 Drawing Sheets

MAGNETORESISTIVE SENSOR SHIELD

BACKGROUND

In a magnetic data storage and retrieval system, a magnetic read/write head includes a reader portion having a magnetoresistive (MR) sensor for retrieving magnetically encoded information stored on a magnetic disc. Magnetic flux from the surface of the disc causes rotation of a magnetization vector of a sensing layer of the MR sensor, which in turn causes a change in electrical resistivity of the MR sensor. The change in resistivity of the MR sensor can be detected by passing a current through the MR sensor and measuring a voltage drop across the MR sensor. External circuitry then converts the voltage information into an appropriate format and manipulates that information to recover the information encoded on the disc.

Improvements in magnetic storage media technology allow areal recording densities on magnetic discs that are available today. However, as areal recording densities increase, smaller, more sensitive MR sensors are desired. As MR sensors become smaller in size, the MR sensors have potential to exhibit an undesirable magnetic response to applied fields from the magnetic disc. An effective MR sensor may reduce or eliminate magnetic noise and provide a signal with adequate amplitude for accurate recovery of the data written on the disc.

SUMMARY

Implementations described and claimed herein provide for a shield positioned on a first side of a sensor stack, the shield including a first layer of ferromagnetic material, a second layer of ferromagnetic material, and a coupling spacer layer separating the first layer and the second layer, wherein a distance between the first layer and the second layer is greater in a region proximal to the sensor stack than in a region away from the sensor stack.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

DETAILED DESCRIPTION

Pulse slimming (e.g., reducing the width of the magnetic signal detected by a magnetoresistive (MR) sensor) is one way to improve linear density resolution of MR sensors. Pulse slimming, also referred to PW50 reduction, may be accomplished by increasing the permeability of sensor shields. However, increasing shield permeability can incidentally reduce shield stability. A shield with globally increased permeability is more likely to couple to a writer element or an exterior stray field of a transducer head, decreasing a signal to noise (SNR) ratio of a signal read from a magnetic media. Thus, there are competing objectives of both increasing shield permeability to improve PW50 and keeping shield permeability low to preserve shield stability in MR sensors.

The implementations disclosed herein provide MR sensor shield designs that allow for locally enhanced shield permeability proximal to a sensor stack to achieve a desired PW50 decrease while mitigating incidental reductions in signal quality. In particular, the example MR sensors disclosed herein include a synthetic antiferromagnetic (SAF) shield with a region of locally enhanced permeability. According to one implementation, a non-magnetic layer is inserted between a pair of ferromagnetic layers to decrease anisotropy of a SAF shield in a region proximal to the sensor stack. This region of decreased anisotropy has a permeability (e.g., a local permeability) that is greater than a global permeability of the SAF shield. As used herein, the term "global permeability" refers to a total permeability of one or more shield elements of an MR sensor shield.

The technology disclosed herein may be used in conjunction with a variety of different types of MR sensors (e.g., anisotropic magnetoresistive (AMR) sensors, tunneling magnetoresistive (TMR) sensors, giant magnetoresistive (GMR) sensors, etc.). Accordingly, the implementations disclosed herein may also be applicable to new MR sensor designs that are based on new physical phenomena such as lateral spin valve (LSV), spin-hall effect (SHE), spin torque oscillation (STO), etc.

Figure 1:
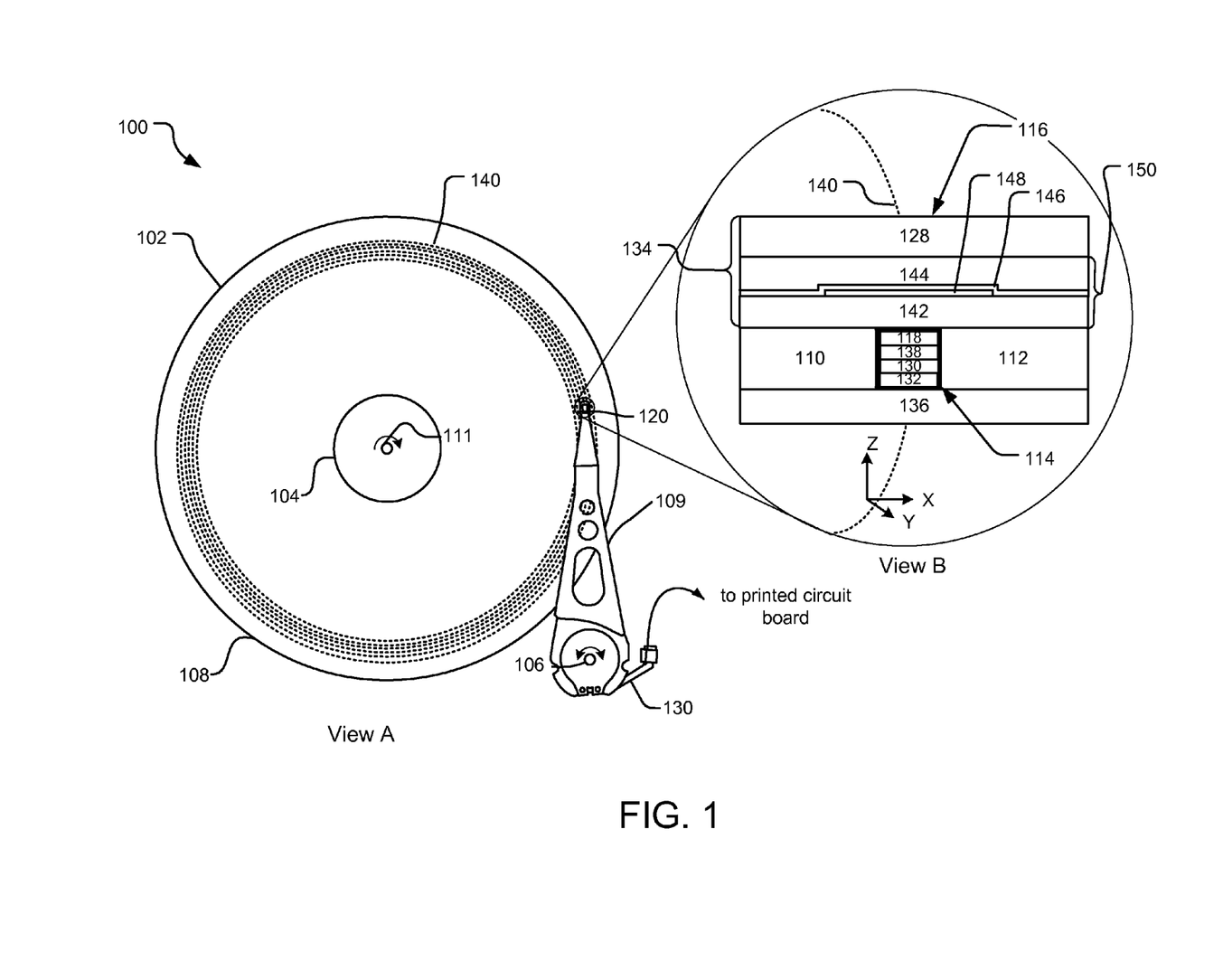
FIG. 1 illustrates a plan view of an example disc drive assembly that includes a magnetoresistive sensor (MR) sensor on a slider.

FIG. 1 illustrates a plan view of an example disc drive assembly 100. The example disc drive assembly 100 includes a slider 120 on a distal end of an actuator arm 109 positioned over a media disc 108. A rotary voice coil motor that rotates about an actuator axis of rotation 106 is used to position the slider 120 on a data track (e.g., a data track 140) and a spindle motor that rotates about disc axis of rotation 111 is used to rotate the media disc 108. Referring specifically to View A, the media 108 includes an outer diameter 102 and inner diameter 104 between which are a number of data tracks (e.g., the data track 140), illustrated by circular dotted lines. A flex cable 130 provides the requisite electrical connection paths for the slider 120 while allowing pivotal movement of the actuator arm 109 during operation.

The slider 120 is a laminated structure with a variety of layers performing a variety of functions. The slider 120 includes a writer section (not shown) having a main write pole magnetically coupled to a return or opposing pole by a yoke or pedestal. A magnetization coil surrounds the yoke or pedestal to induct magnetic write pulses in the write pole.

The slider 120 also includes one or more MR sensors for reading data off of the media disc 108. View B illustrates a side of an MR sensor 116 that faces an air-bearing surface (ABS) of the media disc 108 when the disc drive assembly 100 is in use. Thus, the MR sensor 116 shown in view B may be rotated by about 180 degrees about (e.g., about a z-axis) when operationally attached to the slider 120 shown in View A.

The MR sensor 116 of the slider 120 includes a sensor stack 114, which includes a plurality of layers that perform a plurality of functions. In various implementations, the number of such layers and their associated functions may vary. However, the example sensor stack 114 of FIG. 1 includes a first soft magnetic layer 130 and a second soft magnetic layer 118. The first soft magnetic layer 130 (also termed the "pinned layer") has a magnetic orientation biased in a given direction by an AFM layer 132. A reference layer 138, which may also be made of soft magnetic material, magnetically separates the first soft magnetic layer 130 from the second soft magnetic layer 118. Thus, the second soft magnetic layer 118 rotates freely in response to an external field and is called the "free layer." Such rotation causes a change in electrical resistivity of the sensor stack 114 between a bottom shield 136 and a top shield 134. The changes in electrical resistivity of the sensor stack 114 are correlated to magnetically polarized regions on the media disc 108, which in turn correspond to stored data on the magnetic media.

The top shield 134 and the bottom shield 136 isolate the sensor stack 114 from electromagnetic interference, primarily z-direction interference, and serve as electrically conductive first and second electrical leads connected to processing electronics (not shown). In one implementation, the bottom shield 136 and the top shield 134 permit the sensor stack 114 to be affected by magnetic fields of a data bit directly under the sensor stack 114 while reducing or blocking magnetic field interference of other, adjacent data bits. In operation, a data bit along a track 140 on the media disc 108 may consecutively pass under the top shield 134, under the sensor stack 114, and then under the bottom shield 136. Therefore, the edge of the sensor stack 114 proximal to the top shield 134 may be referred to as the "leading edge" of the sensor stack and the edge of the sensor stack 114 proximal to the bottom shield 136 may be referred to as the "trailing edge" of the sensor stack 114.

The top shield 134 of the MR sensor 116 includes an antiferromagnetic (AFM) pinning layer 128 and a synthetic antiferromagnetic (SAF) structure 150. The SAF structure 150 includes an upper ferromagnetic layer 144, a coupling spacer layer 146, a non-magnetic insert layer 148, and a lower ferromagnetic layer 142. As in other SAF structures, the ferromagnetic layers 144 and 142 have magnetic moments of substantially the same magnitude with substantially opposite orientations. The AFM pinning layer 128 pins the magnetic orientation of the upper ferromagnetic layer 144 in a set direction, and the coupling spacer layer 146 provides an RKKY (Ruderman-Kittel-Kasuya-Yosida) reaction that results in a strong antiferromagnetic coupling between the upper ferromagnetic layer 144 and the lower ferromagnetic layer 142. This coupling is a strong, antiparallel coupling that provides globally increased magnetic anisotropy, which translates to increased shield stability.

The upper ferromagnetic layer 144 and lower ferromagnetic layer 142 each have a z-direction thickness substantially greater than the coupling spacer layer 146. In one implementation, the upper ferromagnetic layer 144 and lower ferromagnetic layer 142 each have a z-direction thickness on the order of about 10-40 nanometers and the coupling spacer layer 146 has a z-direction thickness of about 0.3-1.0 nm. The upper and lower ferromagnetic layers 144 and 142 may be, for example, ferromagnetic alloy material such as CoFe, NiFe, CoNiFe, or CoFeB. The coupling spacer layer 146 may be a non-magnetic material capable of providing an RKKY interaction including, for example, Ru, Cu, Cr, or Mo. In one implementation, the coupling spacer layer 146 is a layer of ruthenium about 1 nm thick.

The non-magnetic insert layer 148 increases a distance between the upper ferromagnetic layer 144 and the lower ferromagnetic layer 142 in a region that is axially aligned (along the z-direction) with a center of the sensor stack 114. The increased separation between the lower ferromagnetic layer 142 and the upper ferromagnetic layer 144 locally disrupts or breaks the RKKY coupling and decreases anisotropy of the SAF structure 150. Such locally decreased anisotropy translates to a localized increase in permeability in a region proximal to the leading edge of the sensor stack 114. As a result, PW50 observed by the MR sensor 116 decreases without significantly affecting stability of the top shield 134. The stability of the top shield 134 may, in at least one implementation, be optimized independently of permeability.

A variety of suitable materials may be used for the non-magnetic spacer layer 148 layer including, without limitation, Ru, Ta, Cr, Cu, Pt and non-magnetic alloys of such materials (e.g., NiRu, NiCr, NiPt, etc). The non-magnetic spacer layer 148 may have a cross-track (x-direction) length that is greater than the cross-track length of the sensor stack 114. In FIG. 1, the non-magnetic spacer layer 148 extends by a distance in the cross-track direction (x-direction) beyond either side of the sensor stack 114. In one example implementation, the sensor stack 114 has a cross-track length that is less than or equal to 50 nm, and the non-magnetic spacer layer 148 has a cross-track length of between approximately 50 and 200 nm.

In addition to the above-described layers, the MR sensor 116 also includes side shields 110 and 112 adjacent to opposite sides of the sensor stack 114, which improve cross-track resolution of the MR sensor 116 by isolating the sensor stack 114 from x-direction (cross-track) interference.

Figure 2:
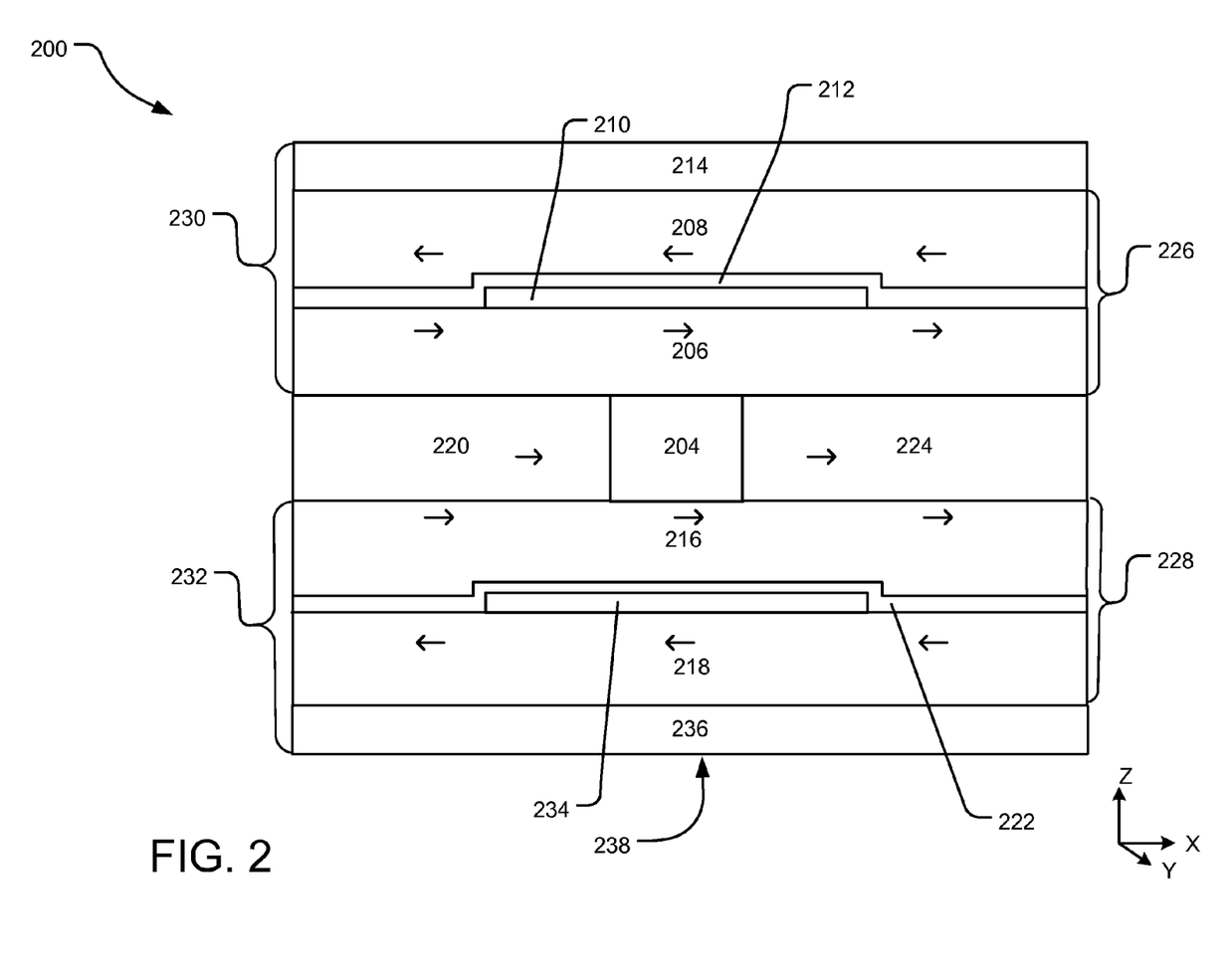
FIG. 2 illustrates an example MR sensor having locally enhanced permeability in SAF structures of both a top shield and a bottom shield.

FIG. 2 illustrates an example MR sensor 200 having regions of locally enhanced permeability on either side of a sensor stack 204. The MR sensor 200 includes a top shield 230 with a first SAF structure 226 and a bottom shield 232 with a second SAF structure 228. Each of the SAF structures 226 and 228 include a pair of ferromagnetic layers (e.g., a first pair of ferromagnetic layers 206 and 208, and a second pair of ferromagnetic layers 216 and 218). Additionally, each of the SAF structures 226 and 228 include a coupling spacer layer (e.g., coupling spacer layers 212 and 222), and a non-magnetic insert layer (e.g., non-magnetic insert layers 210 and 234). AFM pinning layers 214 and 236 abut an outside edge of the first and second SAF structures 226 and 228, respectively, biasing the magnetic orientation of the adjacent ferromagnetic layers 208 and 218 in a preferred direction (e.g., a direction illustrated by arrows within the ferromagnetic layers 208 and 218). The coupling spacer layers 212 and 222 each provide for a strong RKKY antiferromagnetic coupling between each pair of ferromagnetic layers (e.g., the pair of ferromagnetic layers 208 and 206; or the pair of ferromagnetic layers 216 and 218). This strong coupling is locally broken by the non-magnetic insert layers 210 and 234, which creates enhanced permeability in regions including the non-magnetic insert layers 210 and 234.

The sensor stack 204 of the MR sensor 200 includes a plurality of layers (not shown) that perform a plurality of functions. Side shields 220 and 224, which may be made from hard or soft magnetic material, are positioned on opposite sides of the sensor stack 204 and shield the sensor stack 204 from electromagnetic fields in in the cross-track direction (e.g., x-direction). The magnetic orientation of each of the side shields 220 and 224 (shown by arrows within the side shields 220 and 224) is biased by the magnetic orientation of one or both of the adjacent ferromagnetic layers 206 and 216 (shown by arrows within the ferromagnetic layers 206 and 216).

The non-magnetic insert layers 210 and 234 are each positioned between a trailing edge of the sensor stack 238 and an adjacent coupling spacer layer 212 or 222. However, in other implementations, one or both of the non-magnetic insert layers 210 or 234 is positioned on an opposite side of the adjacent coupling spacer layer 212 or 222. For example, the non-magnetic insert layer 210 may be located between the coupling spacer layer 212 and the ferromagnetic layer 208.

The non-magnetic insert layer 210 may have a z-direction thickness that is the same or similar to the thickness of the coupling spacer layer 212. In one implementation, z-direction thickness of one or both of the non-magnetic insert layers 210 and 234 is on the order of about 1 nm. Other features of the MR sensor 200 may be the same or similar to that described above with respect to FIG. 1.

Although the SAF structures 226 and 228 are shown to be identical, such structures may differ from one another in either composition or structure. Either or both of the SAF structures 226 and 228 may contain layers in addition to those shown. Other implementations may omit one or more of the layers shown or replace one or more layers with alternative structures that function similarly. In at least one implementation, an SAF structure (e.g., the SAF structure 228) is included in a bottom shield but not in a top shield.

Figure 3:
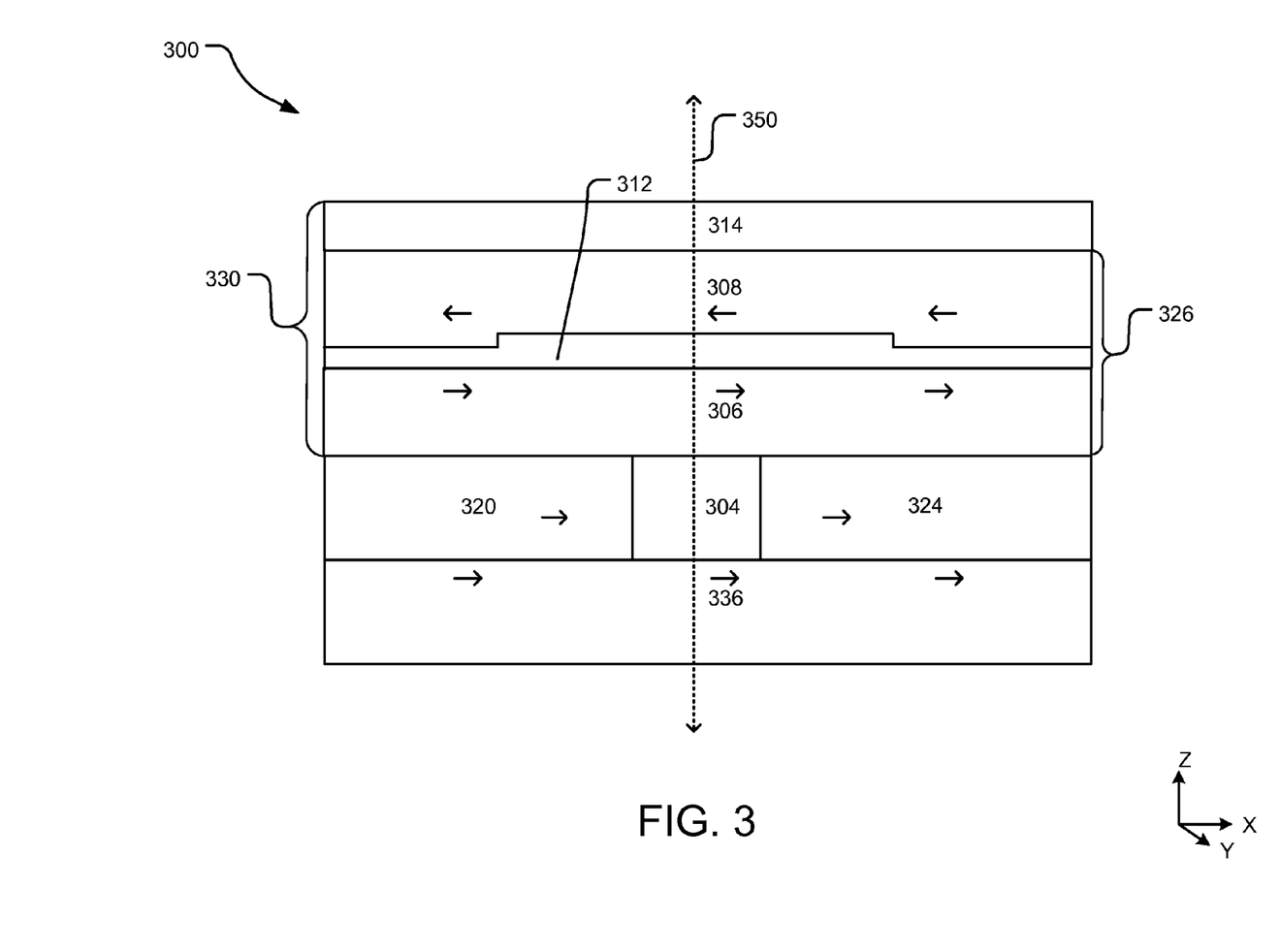
FIG. 3 illustrates an example MR sensor having locally enhanced permeability in an SAF structure of a top shield.

FIG. 3 illustrates an example MR sensor 300 having locally enhanced permeability in an SAF structure 326 of a top shield 330. The SAF structure 326 includes a pair of ferromagnetic layers 306 and 308 on either side of a coupling spacer layer 312. The coupling layer 312 has variable thickness (z-direction thickness) that is greater near a center axis 350 of the MR sensor 300 than near the edges. In operation, the coupling spacer layer 312 provides a strong RKKY antiferromagnetic coupling between the ferromagnetic layers 306 and 308 near the edges of the MR sensor 300. However, this RKKY coupling effect is decreased or eliminated in a central region, axially aligned with a sensor stack 304, where the coupling spacer layer 312 has the increased thickness. Consequently, the top shield 330 has locally enhanced permeability within the region of increased thickness of the coupling spacer layer 312.

In one example implementation, the coupling spacer layer 312 spans substantially an entire cross-track (x-direction) length of the MR sensor 300, which may be, for example, about 10-50 μm. The central region of increased thickness within the coupling spacer layer 312 spans a length of about 50-200 nm in the cross-track direction.

Regions of the coupling spacer layer 312 proximal to outer edges of the MR sensor 300 (e.g., edges intersecting a plane in the cross-track direction) may have a z-direction thickness of about 1 nm, while the central region of increased thickness may have a z-direction thickness of about 2-3 nm.

In addition to the SAF structure 326, the MR sensor 300 includes an AFM pinning layer 314 that biases a magnetic orientation of the ferromagnetic layer 308 in a preferred direction (e.g., the magnetic orientation shown by arrows within the ferromagnetic layer 308). Side shields 320 and 324 are positioned on opposite sides of the sensor stack 304 to shield the sensor stack 304 from electromagnetic fields in in the cross-track direction. Other features of the MR sensor 300 may be the same or similar to that described above with respect to FIGS. 1-2.

Decoupling the SAF structure 326 from the sensor stack 304 and side shields 320 and 324 may further boost resolution gain by allowing for more magnetic rotation within the region of locally enhanced permeability (e.g., within the region of increased thickness of the coupling spacer layer 312 or non-magnetic insert layer shown and described with respect to FIGS. 1-2). Accordingly, FIG. 4 illustrates an example MR sensor 400 that includes a decoupled top shield 430 including an SAF structure 426 with locally enhanced permeability.

The top shield 430 includes an antiferromagnetic (AFM) pinning layer 414 and the SAF structure 426. The SAF structure 426 further includes a pair of ferromagnetic layers 406 and 408, a coupling spacer layer 412, and a non-magnetic insert layer 410. The coupling spacer layer 412 provides for a strong RKKY antiferromagnetic coupling between the ferromagnetic layers 406 and 408. However, this RKKY coupling effect is decreased or eliminated in a central region, axially aligned with a sensor stack 404 that includes the non-magnetic insert layer 410. Locally breaking the RKKY coupling has the effect of locally decreasing anisotropy in a central region of the MR sensor 400 that is axially aligned with the leading edge of the sensor stack 404.

The top shield 430 is decoupled from the sensor stack 404 and side shields 420 and 424 by a non-magnetic decoupling layer 416. Such decoupling permits the side shields 420 and 424 to have a magnetic orientation (shown by arrows within the side shield elements 420 and 424) that is different from the magnetic orientation of an adjacent ferromagnetic layer 406 (shown by arrows within the ferromagnetic layer 406) in the SAF structure 426. In one implementation, the magnetic orientation of the side shields 420 and 424 is opposite or substantially opposite the magnetic orientation of the ferromagnetic layer 406.

Figure 4:
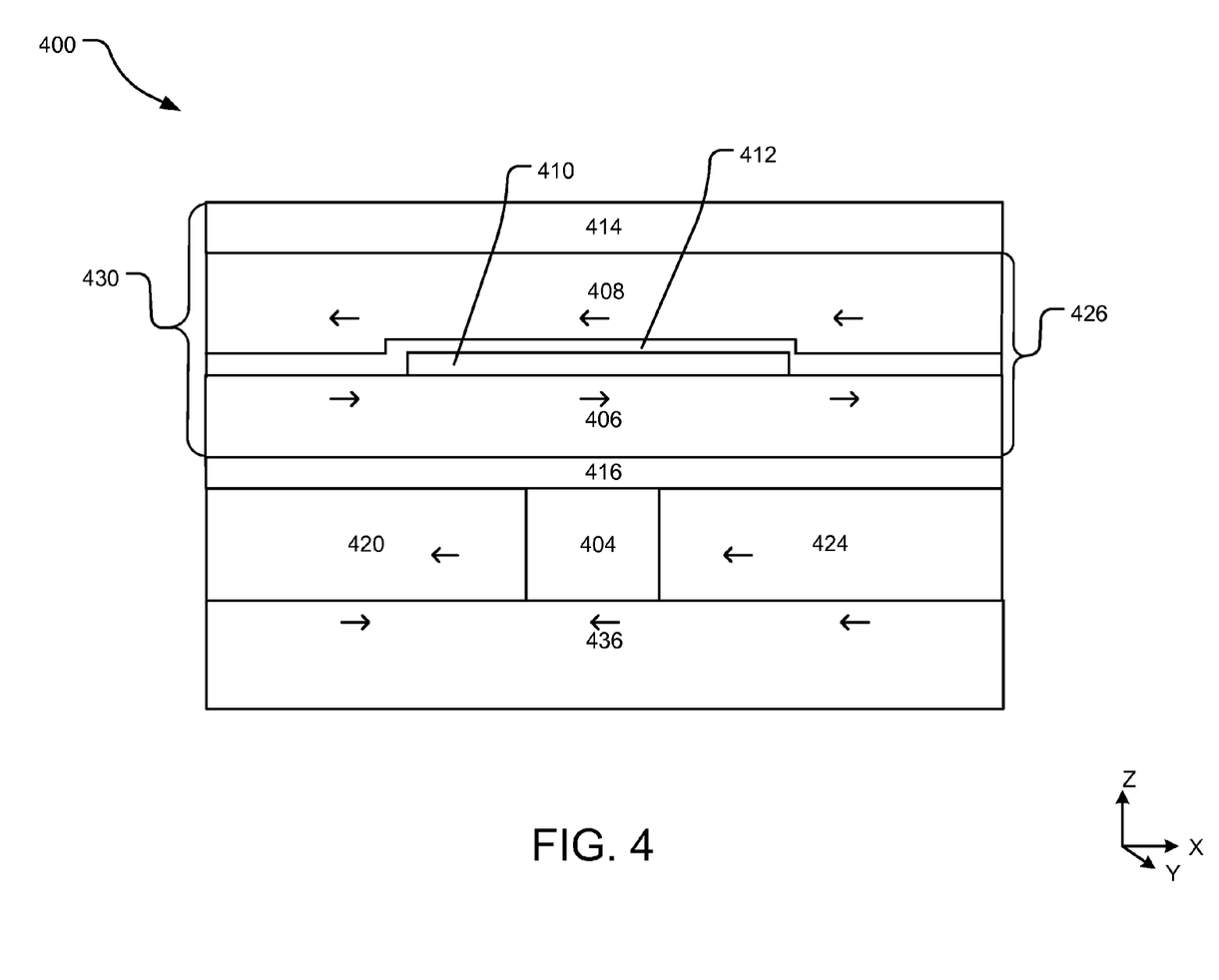
FIG. 4 illustrates an example MR sensor that includes a decoupled top shield including an SAF structure with locally enhanced permeability.

Because the SAF structure 426 of FIG. 4 is decoupled from the side shields 420 and 424, PW50 observed by the MR sensor 400 is improved as compared to implementations where the SAF structure 426 is not decoupled from the side shields 420 and 424 (e.g., FIGS. 1-3). According to one implementation, the MR sensor 400 yields a 1 to 1.5 nm PW50 gain over an otherwise identical implementation with the SAF structure 426 coupled to the side shields 410 and 420.

Figure 5:
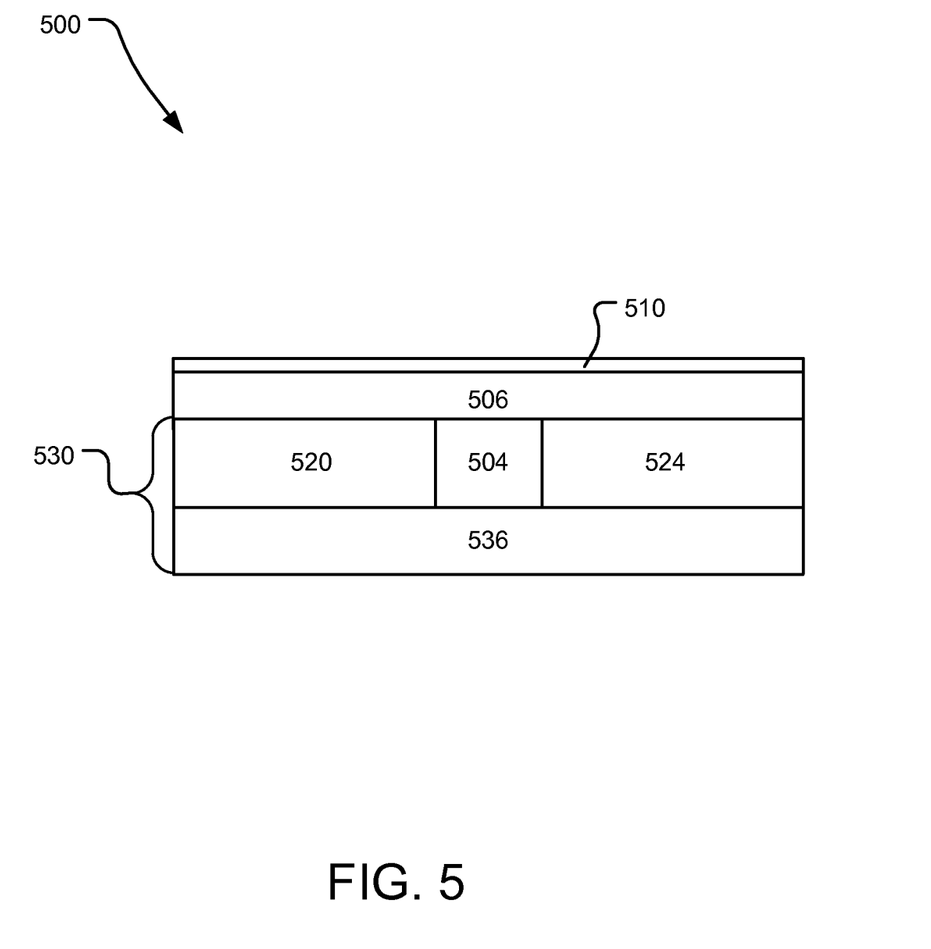
FIG. 5 illustrates a deposition operation performed during formation of a synthetic antiferromagnetic (SAF) structure.
Figure 6:
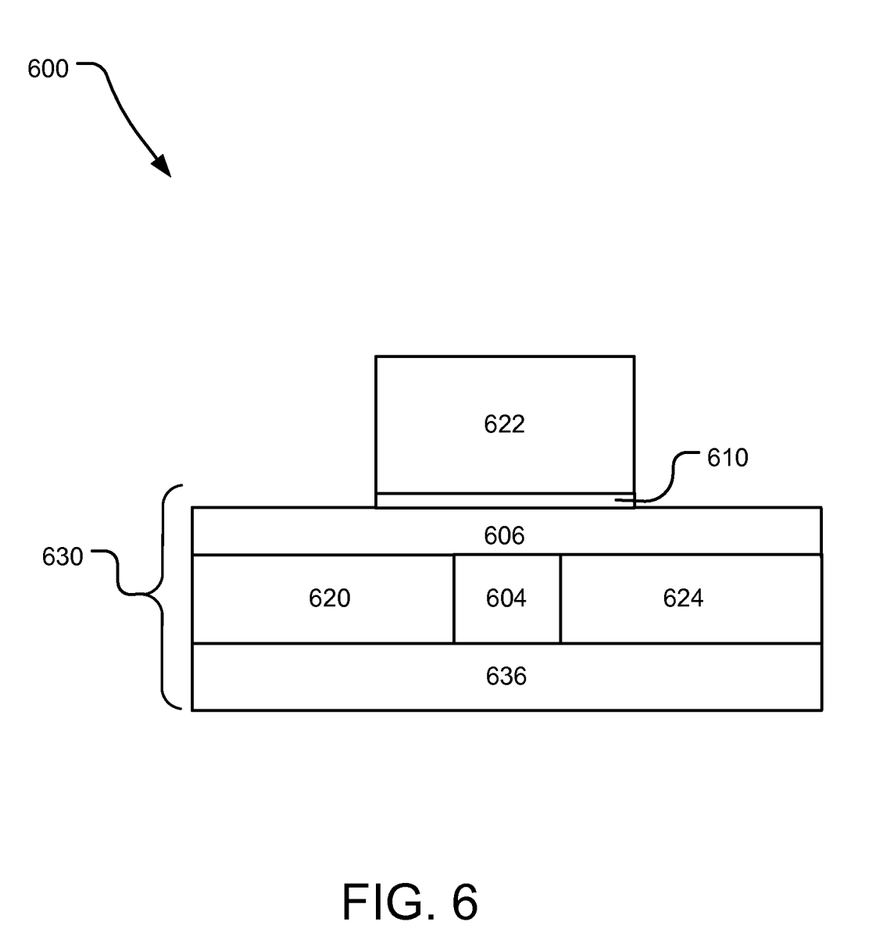
FIG. 6 illustrates masking and milling operations performed during formation of an SAF structure.
Figure 7:
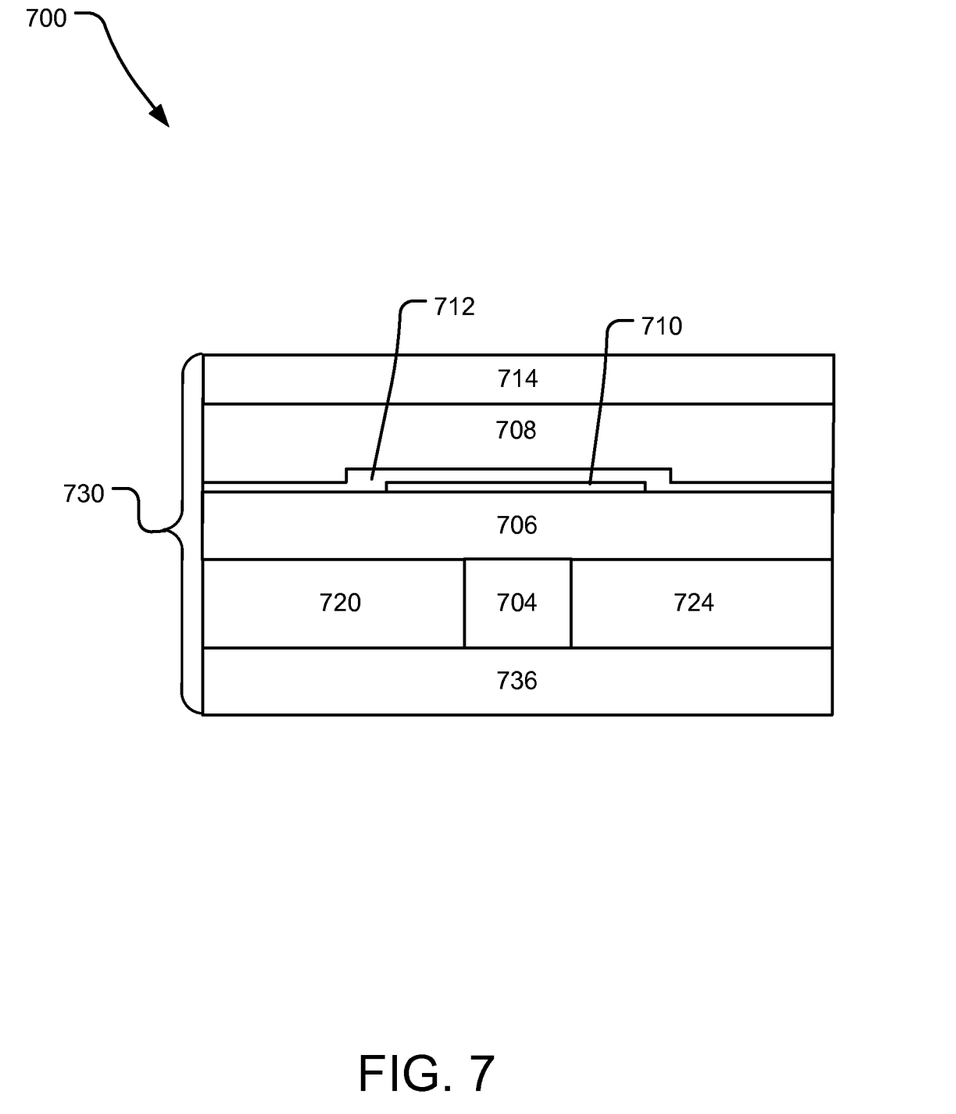
FIG. 7 illustrates mask removal and additional deposition operations performed during formation of an SAF structure.

FIGS. 5-7 illustrate example operations for creating an SAF shield with regions of locally enhanced permeability. FIG. 5 illustrates a deposition operation 500 performed during formation of an SAF structure with locally enhanced permeability. In the deposition operation 500, a layer of ferromagnetic material 506 and a layer of non-magnetic material 510 are deposited on a partially formed MR sensor 530. The partially formed MR sensor 530 includes a bottom shield 536, a sensor stack 504, and side shields 520 and 524. The layer of ferromagnetic material 506 is deposited substantially evenly across the partially formed MR sensor 530 so that the ferromagnetic material 506 is in contact with both the side shields 520 and 524 and the sensor stack 504. The layer of non-magnetic material 510 is deposited substantially evenly across the layer of ferromagnetic material 506.

FIG. 6 illustrates masking and milling operations 600 performed during formation of an SAF structure with locally enhanced permeability. During the masking and milling operations 600, a thin layer of liquid photoresist (not shown) is deposited substantially evenly across a partially formed MR sensor 630. The partially formed MR sensor 600 includes a bottom shield 636, a sensor stack 604, side shields 620 and 624, a layer of ferromagnetic material 606, and a layer of non-magnetic material 610. Portions of the liquid photoresist are exposed to a high intensity light, changing the solubility of either the exposed or unexposed portions (depending on the type of photoresist). The unchanged portions of the photoresist are removed by a developer solution, leaving behind a hardened photoresist mask 622 over a central region of the partially formed MR sensor 630. The hardened photoresist mask 622 protects the underlying non-magnetic material 610 in the central region while the unmasked non-magnetic material (not shown) is milled away near the edges of the partially formed MR sensor 630.

FIG. 7 illustrates mask removal and additional deposition operations 700 performed during formation of an SAF structure with locally enhanced permeability. During the mask removal and layer building operations 700, photoresist solvents are used to remove a hardened photoresist mask (e.g., a mask the same or similar to the hardened photoresist mask 622 of FIG. 6) from an MR sensor 730 after formation of a bottom shield 736, a sensor stack 704, side shields 720 and 724, a layer of ferromagnetic material 706, and a layer of non-magnetic material 710. After the hardened photoresist mask is removed, a coupling spacer layer 712 is deposited on top of and in contact with the non-magnetic material 710; another ferromagnetic layer 708 is deposited to top of and in contact with the coupling spacer layer 712; and an AFM layer 714 is deposited on top of and in contact with the ferromagnetic layer 708.

Figure 8:
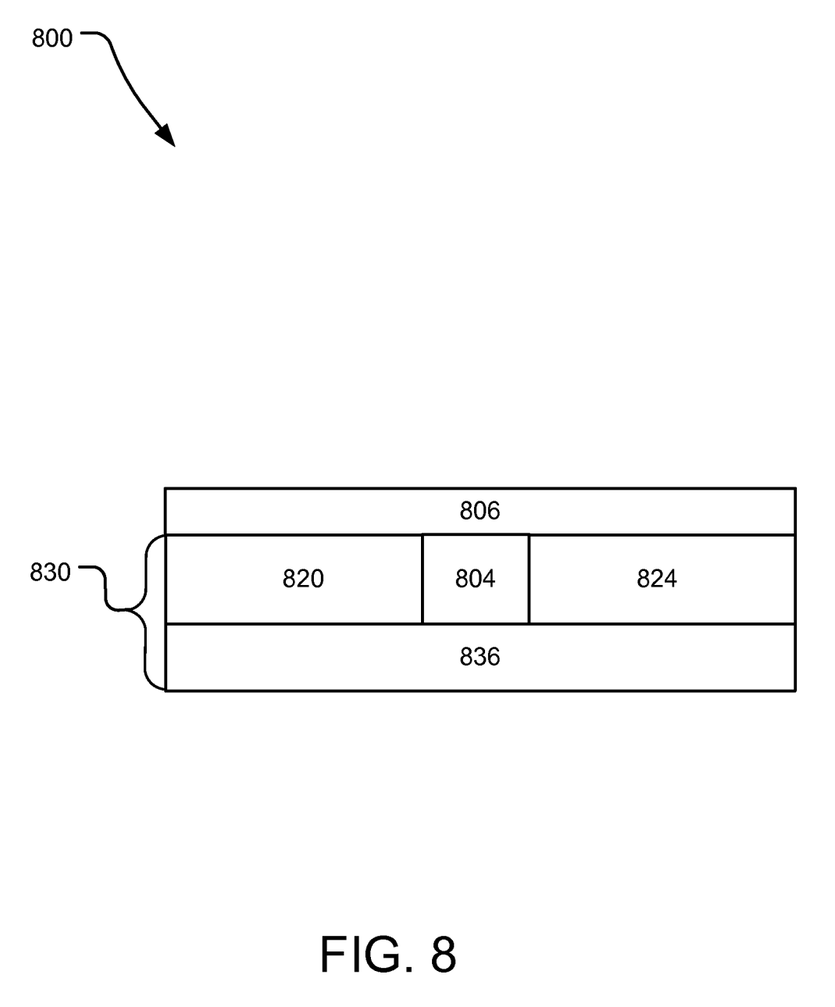
FIG. 8 illustrates a deposition operation performed during formation of an SAF structure.
Figure 9:
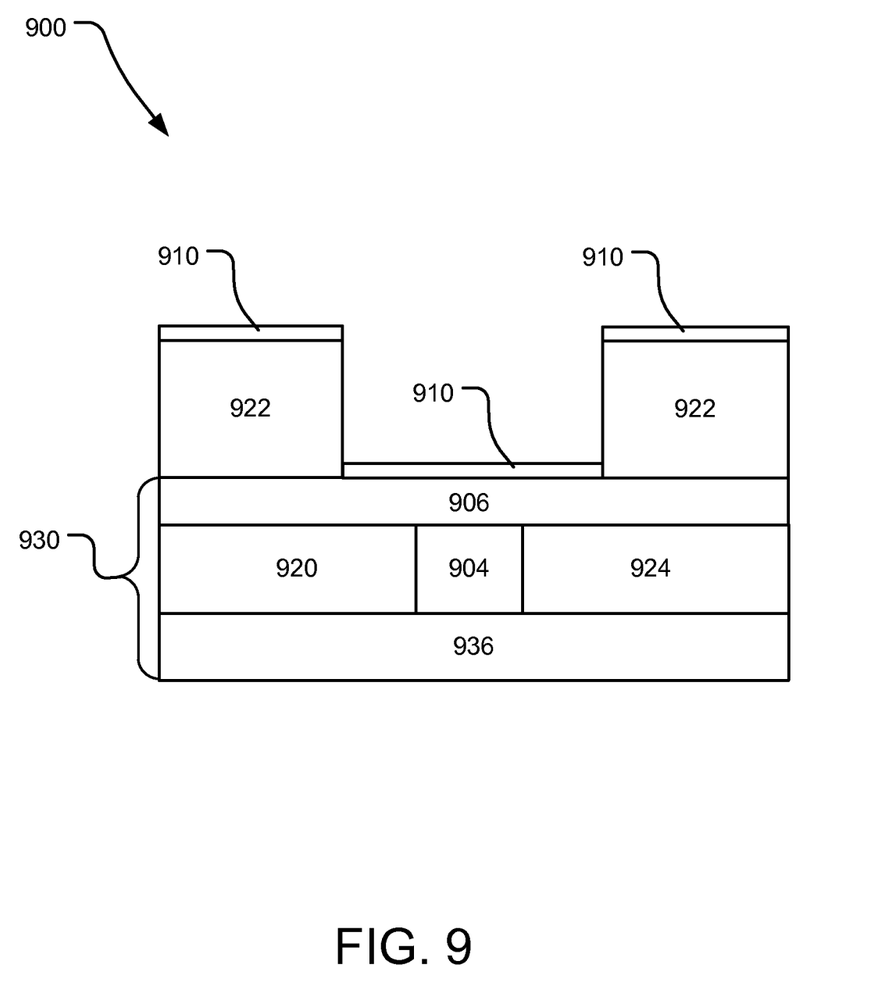
FIG. 9 illustrates masking and deposition operations performed during formation of an SAF structure.
Figure 10:
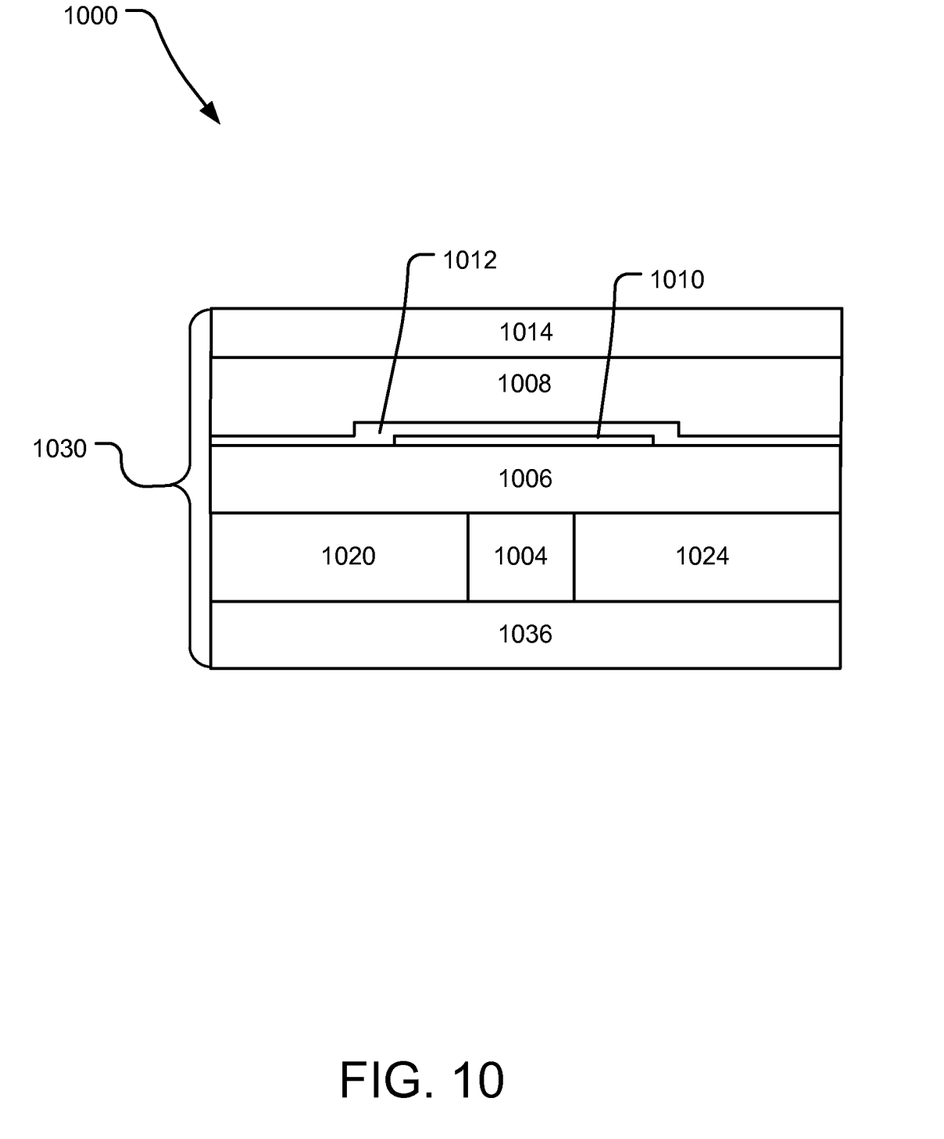
FIG. 10 illustrates mask removal and additional deposition operations performed during formation of an SAF structure.

FIGS. 8-10 illustrate additional example operations for creating an SAF shield with a region of locally enhanced permeability. FIG. 8 illustrates a deposition operation 800 performed during formation of an SAF structure with locally enhanced permeability. In the deposition operation 800, a layer of ferromagnetic material 806 is deposited on a partially formed MR sensor 830. The partially formed MR sensor 820 includes a bottom shield 836 with a sensor stack 804 formed and side shields 820 and 824 formed thereon. The layer of ferromagnetic material 806 is deposited substantially evenly across the partially formed MR sensor 830 so that the ferromagnetic material 806 is in contact with both the side shields 820 and 824 and the sensor stack 804.

FIG. 9 illustrates masking and deposition operations 900 performed during formation of an SAF structure with locally enhanced permeability. During the masking and deposition operations 900, a thin layer of liquid photoresist (not shown) is deposited substantially evenly across an MR sensor 930 which includes a bottom shield 936, a sensor stack 904, side shields 920 and 924, and a layer of ferromagnetic material 906. Portions of the liquid photoresist are exposed to a high intensity light, changing the solubility of either the exposed or unexposed portions (depending on the type of photoresist). The unchanged portions of the photoresist are removed by a developer solution, leaving behind a hardened photoresist mask 922 over outer edge regions of the partially formed MR sensor 930. The hardened photoresist mask 922 protects the underlying ferromagnetic material 906 in the outer edge regions while leaving exposed the ferromagnetic material 906 within a central region. While the hardened photoresist mask is in place, a layer of non-magnetic material 910 is deposited substantially evenly across the partially formed MR sensor 930.

FIG. 10 illustrates mask removal and additional deposition operations 1000 performed during formation of an SAF structure with locally enhanced permeability. During the mask removal and layer building operations 1000, photoresist solvents are used to remove a hardened photoresist mask (e.g., a mask the same or similar to the hardened photoresist mask 922 of FIG. 9) from an MR sensor 1030 after formation of a bottom shield 1036, a sensor stack 1004, side shields 1020 and 1024, a layer of ferromagnetic material 1006, and a layer of non-magnetic material 1010. After the hardened photoresist mask is removed, a coupling spacer layer 1012 is deposited on top of and in contact with the non-magnetic material 1010; another ferromagnetic layer 1008 is deposited to top of and in contact with the coupling spacer layer 1012; and an AFM layer 1014 is deposited on top of and in contact with the ferromagnetic layer 1008.

The specific steps discussed with respect to each of the implementations disclosed herein are a matter of choice and may depend on the materials utilized and/or design criteria of a given system. The above specification, examples, and data provide a complete description of the structure and use of exemplary implementations of the invention. Since many implementations of the invention can be made without departing from the spirit and scope of the invention, the invention resides in the claims hereinafter appended.

What is claimed is:

1. A sensor apparatus comprising:
   a shield positioned on a first side of a sensor stack, the shield including:
      a first layer of ferromagnetic material;
      a second layer of ferromagnetic material;
      a coupling spacer layer separating the first layer and the second layer, wherein a distance between the first layer and the second layer is greater in a region proximal to the sensor stack than in a region away from the sensor stack.

2. The sensor apparatus of claim 1, wherein the coupling spacer layer has a variable thickness.

3. The sensor apparatus of claim 1, wherein the distance between the first layer and the second layer is greater in a region that is axially aligned with a center of the sensor stack than in a region away from the sensor stack.

4. The sensor apparatus of claim 1, further comprising:
   a non-magnetic layer between the first layer and the second layer.

5. The sensor apparatus of claim 4, wherein the non-magnetic layer has opposing edges that extend in a cross-track direction beyond opposing surfaces of the sensor stack.

6. The sensor apparatus of claim 1, wherein the first layer, the second layer, and the coupling spacer layer form a synthetic antiferromagnetic (SAF) structure of a top shield of the sensor stack.

7. The sensor apparatus of claim 1, wherein the first layer, the second layer, and the coupling spacer layer form an SAF structure of a bottom shield of the sensor stack.

8. A sensor apparatus comprising:
   a shield positioned on a first side of a sensor stack, the shield comprising:
      a first layer of ferromagnetic material;
      a second layer of ferromagnetic material;
      a coupling spacer layer separating the first layer and the second layer, wherein a distance between the first layer and the second layer is greater in a region proximal to the sensor stack than in a region away from the sensor stack; and
   a non-magnetic layer separating the shield from the sensor stack.

9. The sensor apparatus of claim 8, wherein the coupling spacer layer has a variable thickness.

10. The sensor apparatus of claim 8, wherein the distance between the first layer and the second layer is greater in a region that is axially aligned with a center of the sensor stack than in a region away from the sensor stack.

11. The sensor apparatus of claim 8, wherein the non-magnetic layer has a length in the cross-track direction that is greater than a length of the sensor stack in the cross-track direction.

12. The sensor apparatus of claim 8, wherein the first layer, the second layer, and the coupling spacer layer form a synthetic antiferromagnetic (SAF) structure of a top shield of the sensor apparatus.

13. The sensor apparatus of claim 8, wherein the first layer, the second layer, and the coupling spacer layer form a SAF structure of a bottom shield of the sensor apparatus.

14. The sensor apparatus of claim 8, wherein the non-magnetic layer has opposing edges that extend in a cross-track direction beyond opposing surfaces of the sensor stack.

* * * * *